(12) United States Patent
Goto et al.

(10) Patent No.: US 11,411,547 B2
(45) Date of Patent: Aug. 9, 2022

(54) JOINT AND ELASTIC WAVE ELEMENT

(71) Applicant: NGK INSULATORS, LTD., Nagoya (JP)

(72) Inventors: Masashi Goto, Nagoya (JP); Yudai Uno, Nagoya (JP); Tomoyoshi Tai, Inazawa (JP)

(73) Assignee: NGK INSULATORS, LTD., Nagoya (JP)

( * ) Notice: Subject to any disclaimer, the term of this patent is extended or adjusted under 35 U.S.C. 154(b) by 130 days.

(21) Appl. No.: 17/032,814

(22) Filed: Sep. 25, 2020

(65) Prior Publication Data
US 2021/0013863 A1 Jan. 14, 2021

Related U.S. Application Data

(63) Continuation of application No. PCT/JP2019/010489, filed on Mar. 14, 2019.

(30) Foreign Application Priority Data

Mar. 29, 2018 (JP) .............................. JP2018-063856

(51) Int. Cl.
*H03H 9/02* (2006.01)
*H03H 9/25* (2006.01)

(52) U.S. Cl.
CPC .... *H03H 9/02574* (2013.01); *H03H 9/02559* (2013.01); *H03H 9/25* (2013.01)

(58) Field of Classification Search
CPC .. H03H 9/02574; H03H 9/02559; H03H 9/25; H03H 9/02897; H03H 9/176;
(Continued)

(56) References Cited

U.S. PATENT DOCUMENTS 7,213,314 B2     5/2007   Abbott et al.
10,284,169 B2 *  5/2019   Goto ........................ H03H 9/17
(Continued)

FOREIGN PATENT DOCUMENTS

DE    112018000012 T5    11/2018
JP       2004535664 A    11/2004
(Continued)

OTHER PUBLICATIONS

Office Action from German Patent Office issued in corresponding German Application No. 11 2019 001 662.8 with English Translation dated Apr. 8, 2021 (14 pages).
(Continued)

*Primary Examiner* — Emily P Pham
(74) *Attorney, Agent, or Firm* — Flynn Thiel, P.C.

(57) ABSTRACT

A bonded body includes a supporting substrate composed of a polycrystalline ceramic material or monocrystalline material, a piezoelectric single crystal substrate and a bonding layer provided between the supporting substrate and piezoelectric single crystal substrate. The bonding layer has a composition of $Si_{(1-x)}O_x$ (x represents an oxygen ratio). The oxygen ratio is increased or decreased from an end part of the bonding layer on the side of the piezoelectric single crystal substrate to an end part of the bonding layer on the side of the supporting substrate. The maximum value of the oxygen ratio x in the bonding layer is 0.013 or higher and 0.666 or lower, and the minimum value of the oxygen ratio is 0.001 or higher and 0.408 or lower.

6 Claims, 6 Drawing Sheets

(58) Field of Classification Search
CPC ......... H03H 3/08; H01L 41/313; H01L 41/09; H01L 41/312
See application file for complete search history.

(56) References Cited

U.S. PATENT DOCUMENTS

| | | | |
|---|---|---|---|
| 2004/0226162 A1 | 11/2004 | Miura et al. | |
| 2005/0029224 A1 | 2/2005 | Aspar et al. | |
| 2010/0182101 A1 | 7/2010 | Suzuki | |
| 2019/0007022 A1 | 1/2019 | Goto et al. | |
| 2021/0013864 A1* | 1/2021 | Goto | H01L 41/313 |

FOREIGN PATENT DOCUMENTS

| | | |
|---|---|---|
| JP | 3774782 B2 | 12/2004 |
| JP | 2004351832 A | 12/2004 |
| JP | 201089993 A | 4/2010 |
| JP | 2010187373 A | 8/2010 |
| JP | 3184763 U | 7/2013 |
| JP | 201486400 A | 5/2014 |

OTHER PUBLICATIONS

English Translation of the International Preliminary Report on Patentability, issued in corresponding International Application No. PCT/JP2019/010489, dated Oct. 8, 2020 (6 pages).

International Search Report with English Translation issued in corresponding International Application No. PCT/JP2019/010489 dated Jun. 4, 2019 (5 pages).

Written Opinion of International Searching Authority issued in corresponding International Application No. PCT/JR2019/010489 dated Jun. 4, 2019 (3 pages).

* cited by examiner

JOINT AND ELASTIC WAVE ELEMENT

CROSS-REFERENCE TO RELATED APPLICATIONS

This is a continuation of PCT/JP2019/010489, filed Mar. 14, 2019, which claims priority from Japanese Application No. 2018-063856, filed Mar. 29, 2018, the entire contents of which are hereby incorporated by reference.

TECHNICAL FIELD

The present invention relates to a bonded body of a piezoelectric single crystal substrate and supporting substrate, and an acoustic wave device including the same.

BACKGROUND ARTS

It is known a surface acoustic wave device functioning as a filter device or oscillator used in mobile phones or the like and an acoustic wave device such as lamb wave device or film bulk acoustic resonator (FBAR) using a piezoelectric thin film. As such acoustic wave device, it is known a device produced by adhering a supporting body and a piezoelectric substrate propagating a surface acoustic wave and by providing interdigitated electrodes capable of oscillating the surface acoustic wave on a surface of the piezoelectric substrate. By adhering the supporting body, whose thermal expansion coefficient is lower than that of the piezoelectric substrate, onto the piezoelectric substrate, the change of a size of the piezoelectric substrate responsive to temperature change is reduced so that the change of the frequency characteristics as the surface acoustic wave device is reduced.

It is proposed, in patent document 1, a surface acoustic wave device having the structure produced by adhering a piezoelectric single crystal substrate and silicon substrate with an adhesive layer composed of an epoxy adhering agent.

Here, it is known that, in bonding a piezoelectric substrate and silicon substrate, a silicon oxide film is formed on a surface of the piezoelectric substrate, and the silicon substrate and the piezoelectric substrate are bonded through the silicon oxide film. In the bonding, plasma beam is irradiated onto the surfaces of the silicon oxide film and silicon substrate to activate the surfaces, followed by the direct boding (patent document 2).

Further, it is known a direct bonding method of so-called FAB (Fast Atom Beam) system. According to this method, neutralized atomic beam is irradiated onto the respective bonding surfaces at ambient temperature and the direct bonding is performed (patent document 3).

It is described that a piezoelectric single crystal substrate is directly bonded to a supporting substrate composed of a ceramic material (alumina, aluminum nitride, silicon nitride) through an intermediate layer, not to a silicon substrate (Patent document 4). It is described that the material of the intermediate layer is made silicon, silicon oxide, silicon nitride or aluminum nitride.

Further, when a piezoelectric substrate and a supporting substrate are bonded with an organic adhesive, Rt (maximum height of the profile of a roughness curve) of an adhesive surface of the supporting substrate to the piezoelectric substrate is made 5 nm or larger and 50 nm or smaller to obtain the effect of preventing the fracture by the stress relaxation (Patent document 5).

PRIOR TECHNICAL DOCUMENTS

Related Documents (Patent document 1) Japanese Patent Publication No. 2010-187373A
(Patent document 2) U.S. Pat. No. 7,213,314 B2
(Patent document 3) Japanese Patent Publication No. 2014-086400A
(Patent document 4) Japanese Patent Publication No. 3774782B
(Patent document 5) Japanese Utility model Registration No. 3184763U

SUMMARY OF THE INVENTION

However, depending on applications of the bonded body, it is desired to improve the insulating property by raising the electric resistance of the bonding layer. For example, in the case of an acoustic wave device, noise or loss can be reduced, by improving the insulating property of the bonding layer. However, it is difficult to bond the supporting substrate to the piezoelectric single crystal substrate through the bonding layer of a high resistance at a high strength, so that the peeling tends to occur between the piezoelectric single crystal substrate and supporting substrate during the subsequent processing step and the Q value of the acoustic wave device tends to become lower.

An object of the present invention is, in a bonded body including a supporting substrate composed of a polycrystalline ceramic material or monocrystalline material, a piezoelectric single crystal substrate and a bonding layer provided between the supporting substrate and piezoelectric single crystal substrate, to improve the bonding strength of the supporting substrate and piezoelectric single crystal substrate and to improve the Q value.

The present invention provides a bonded body comprising:
a supporting substrate comprising a polycrystalline ceramic material or a monocrystalline material;
a piezoelectric single crystal substrate; and
a bonding layer provided between the supporting substrate and the piezoelectric single crystal substrate,
wherein the bonding layer has a composition of $Si_{(1-x)}O_x$ (x indicates an oxygen ratio),
wherein the oxygen ratio is increased or decreased from an end part of the bonding layer on a side of the piezoelectric single crystal substrate to an end part of the bonding layer on a side of the supporting substrate,
wherein the maximum value of the oxygen ratio x in the bonding layer is 0.013 or higher and 0.666 or lower, and
wherein the minimum value of the oxygen ratio x is 0.001 or higher and 0.408 or lower.

The present invention further provides an acoustic wave device comprising:
the bonded body; and
an electrode provided on the piezoelectric single crystal substrate.

According to the present invention, in the bonded body including the supporting substrate composed of the polycrystalline ceramic material or monocrystalline material, piezoelectric single crystal substrate and bonding layer between the supporting substrate and piezoelectric single crystal substrate, it is possible to raise the insulating property of the bonding layer and improve the bonding strength of the supporting substrate and piezoelectric single crystal substrate. It is thereby possible to provide an acoustic wave device having a high bonding strength and Q value.

EMBODIMENTS FOR CARRYING OUT THE INVENTION

The present invention will be described further in detail below, appropriately referring to drawings.

Figure 1A:
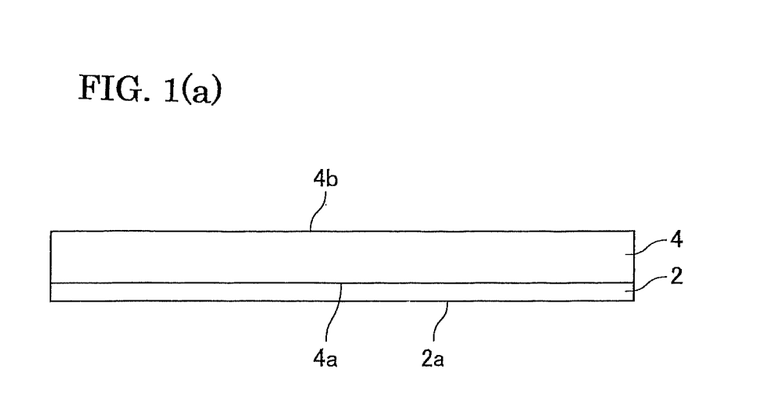
FIG. 1(a) shows the state that a bonding layer 2 is provided on a piezoelectric single crystal substrate 4.
Figure 1B:
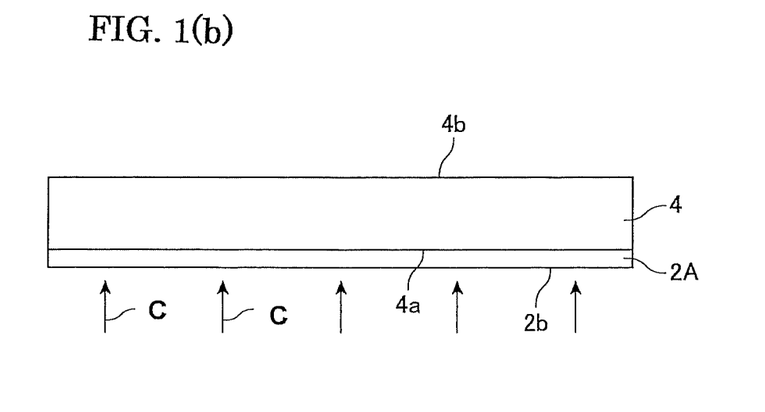
FIG. 1(b) shows the state that a surface 2b of a bonding layer 2A is activated by neutralized beam C.
Figure 1C:
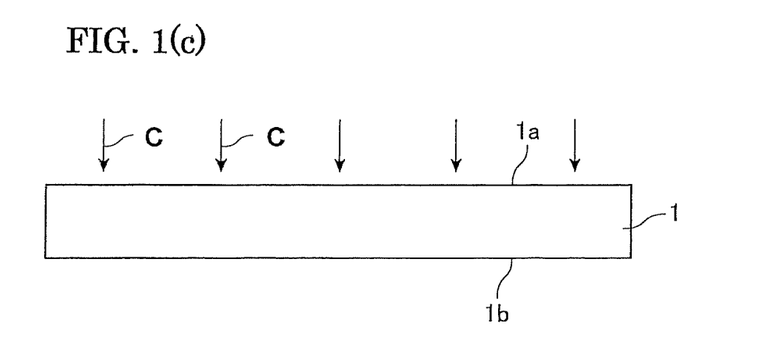
FIG. 1(c) shows the state that a surface 1a of a supporting substrate 1 is activated by neutralized beam C.
Figure 2A:
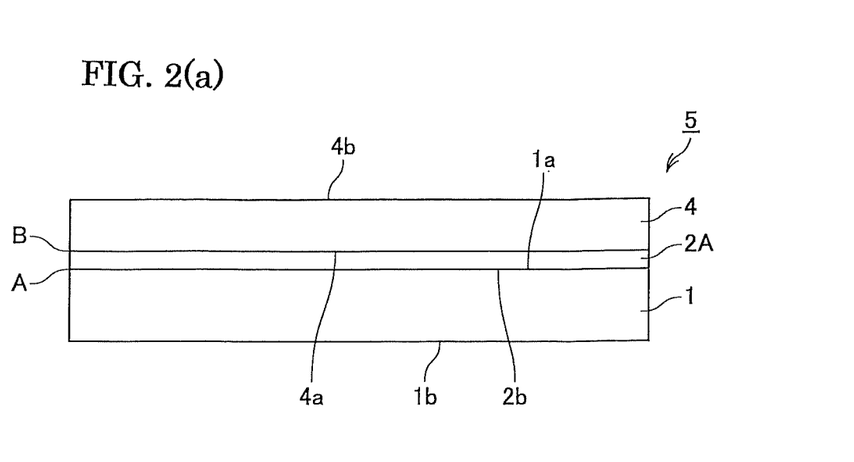
FIG. 2(a) shows the state that the supporting substrate 1 is directly bonded with the bonding layer 2A.
Figure 2B:
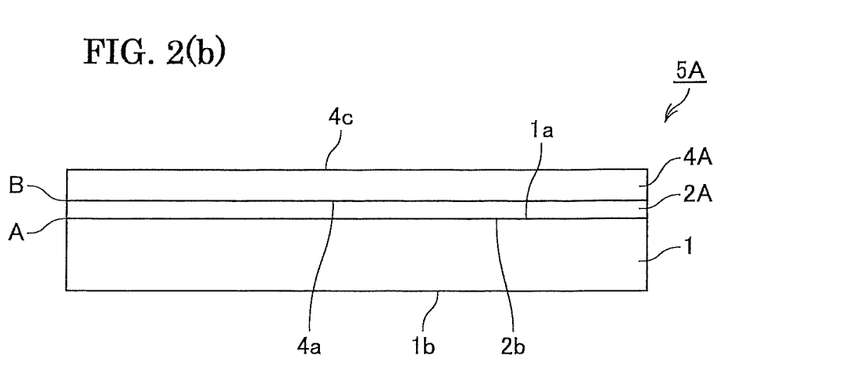
FIG. 2(b) shows the state that a piezoelectric single crystal substrate 4A is thinned by processing.
Figure 2C:
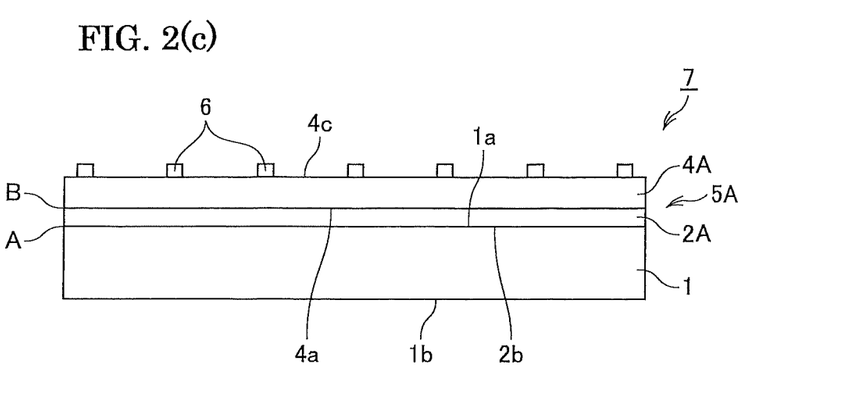
FIG. 2(c) shows the state that an electrode 6 is provided on the piezoelectric single crystal substrate 4A.

FIGS. 1 and 2 relate to an embodiment, in which a bonding layer 2 is provided on a piezoelectric single crystal substrate 4 and directly bonded to a surface 1a of a supporting substrate 1.

As shown in FIG. 1(a), the bonding layer 2 is provided on a surface 4a of the piezoelectric single crystal substrate 4. 4b represents a surface on the opposite side. At this time, unevenness may be present on the surface 2a of the bonding layer 2.

Then, according to a preferred embodiment, the surface 2a of the bonding layer 2 is subjected to flattening process to form a flat surface 2b of the bonding layer 2, as shown in FIG. 1(b). By this flattening process, the thickness of the bonding layer 2 is normally made smaller to provide a thinner bonding layer 2A (refer to FIG. 1(b)). However, the flattening process is not necessarily performed. Then, neutralized beam is irradiated onto the surface 2b of the bonding layer 2A as arrows A to activate the surface 2b of the bonding layer 2A to provide an activated surface.

Further, as shown in FIG. 1(c), neutralized beam is irradiated onto the surface 1a of the supporting substrate 1. Then, as shown in FIG. 2(a), the activated surface 1a of the supporting substrate 1 and activated surface 2b of the bonding layer 2A are directly bonded with each other to obtain a bonded body 5.

According to a preferred embodiment, the surface 4b of the piezoelectric single crystal substrate 4 of the bonded body 5 is further subjected to polishing to make the thickness of the piezoelectric single crystal substrate 4A smaller as shown in FIG. 2(b), to obtain a bonded body 5A. 4c represents a polished surface.

As shown in FIG. 2(c), predetermined electrodes 6 are formed on the polished surface 4c of the piezoelectric single crystal substrate 4A to produce an acoustic wave device 7.

Figure 3:
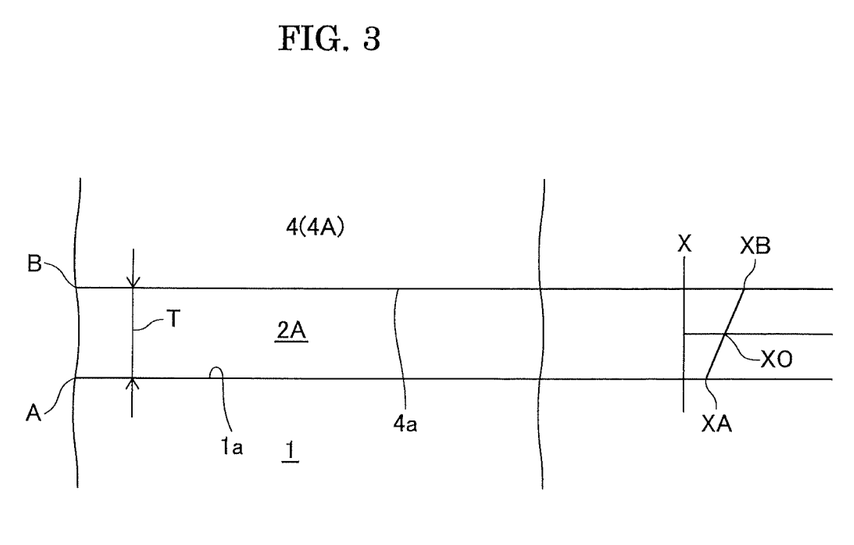
FIG. 3 is a conceptual diagram showing oxygen ratio in the bonding layer 2A.

According to the present invention, the bonding layer 2A has a composition of $Si_{(1-x)}O_x$ (x represents an oxygen ratio). Then, as shown in FIG. 3, the oxygen ratio x is increased or decreased from an end part of the bonding layer 2A on the side of the piezoelectric single crystal substrate 4 (4A) to an end part of the bonding layer 2A on the side of the supporting substrate 2A. That is, the oxygen ratio in the bonding layer 2A is inclined. Further, the maximum value of the oxygen ratio x in the bonding layer 2A is 0.013 or higher and 0.666 or lower, and the minimum value of the oxygen ratio x is 0.001 or higher and 0.408 or lower. It is thereby possible to provide an acoustic wave device having a high bonding strength and high Q value.

Here, according to the embodiment shown in FIGS. 1 to 3, the oxygen ratio x is decreased from the end part of the bonding layer 2A on the side of the piezoelectric single crystal substrate 4 (4A) to the end part of the bonding layer 2A on the side of the supporting substrate 1. The oxygen ratio xB at the end part in the bonding layer 2A on the side of the piezoelectric single crystal substrate 4 (4A) is the maximum value described above and 0.013 or higher and 0.666 or lower, and the oxygen ratio xA at the end part of the bonding layer 2A on the side of the supporting substrate 1 is the minimum value described above and 0.001 or higher and 0.408 or lower. The oxygen ratio xO at the central part of the bonding layer is between the oxygen ratios xA and xB.

According to the present invention, the maximum value of the oxygen ratio x in the bonding layer 2A is 0.013 or higher and 0.666 or lower. It is thereby possible to considerably improve the Q value and to improve the bonding strength of the piezoelectric single crystal substrate 4 (4A) to the supporting substrate 1. On the viewpoint, the maximum value of the oxygen ratio x in the bonding layer 2A may preferably be made 0.05 or higher.

Further, according to the present invention, the minimum value of the oxygen ratio x in the bonding layer 2A is 0.001 or higher and 0.408 or lower. It is thereby possible to provide an acoustic wave device having a high bonding strength and high Q value. On the viewpoint, the minimum value of the oxygen ratio x in the bonding layer 2A may preferably be made 0.005 or higher, or 0.3 or lower.

Further, the oxygen ratio xB at the end part of the bonding layer 2A on the side of the piezoelectric single crystal substrate 4 (4A) and oxygen ratio xA at the end part of the bonding layer 2A on the side of the supporting substrate 2 are to be measured as described in the Examples section.

Figure 4A:
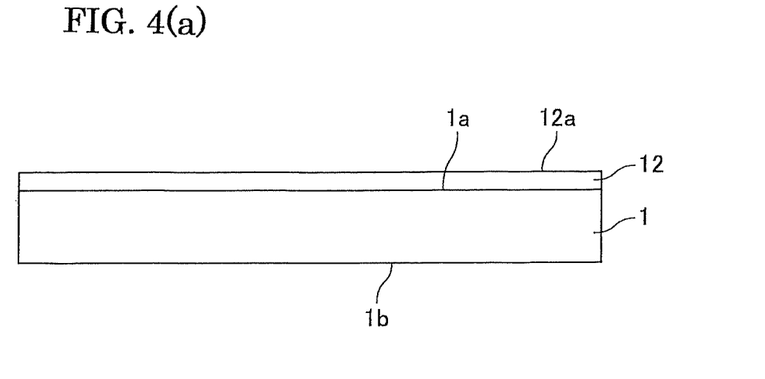
FIG. 4(a) shows the state that a bonding layer 12 is provided on the supporting substrate 1.
Figure 4B:
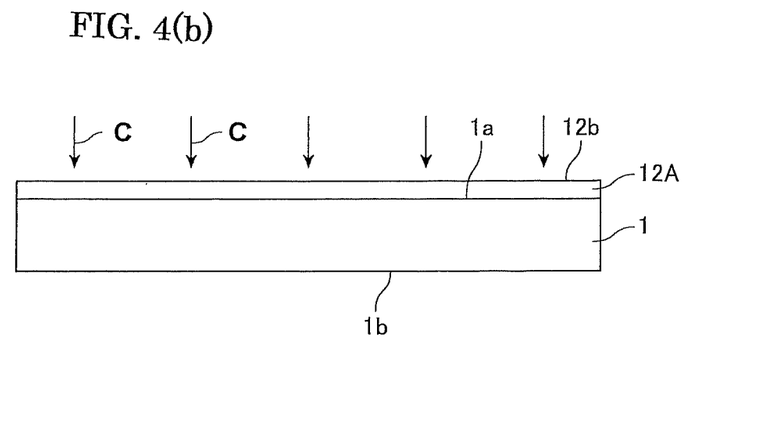
FIG. 4(b) shows the state that a surface 12b of a bonding layer 12A is activated by neutralized beam C.
Figure 4C:
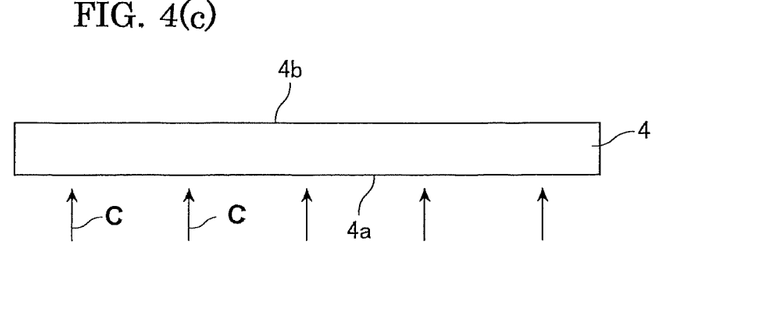
FIG. 4(c) shows the state that a surface 4a of the piezoelectric single crystal substrate 4 is activated by neutralized beam C.
Figure 5A:
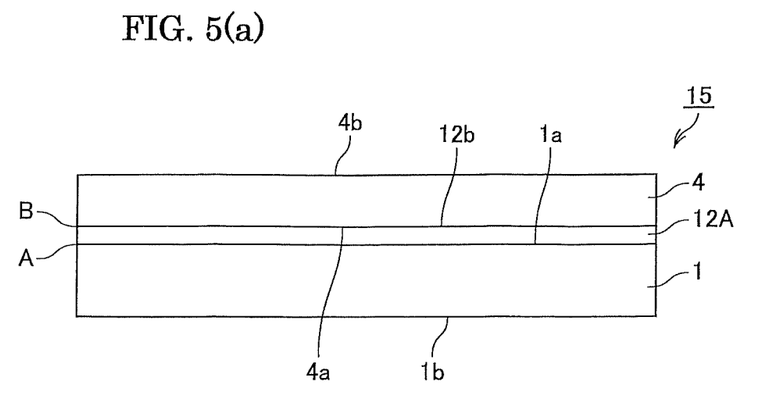
FIG. 5(a) shows the state that the piezoelectric single crystal substrate 4 is directly bonded with the bonding layer 12A.
Figure 5B:
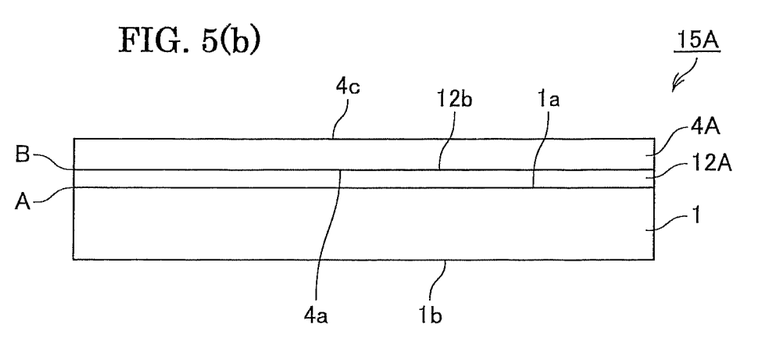
FIG. 5(b) shows the state that the piezoelectric single crystal substrate 4A is thinned by processing.
Figure 5C:
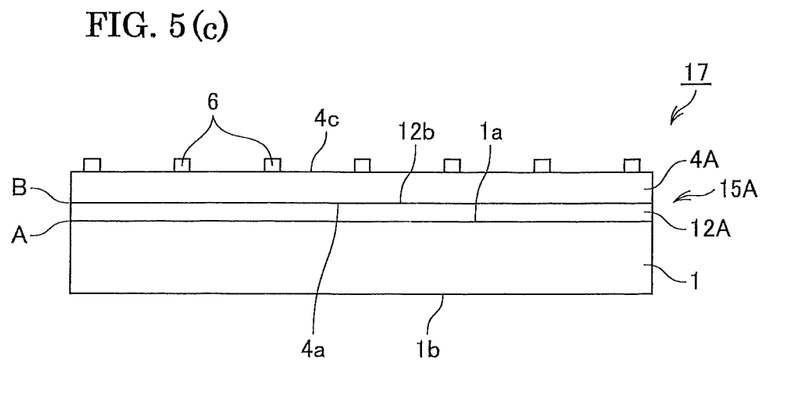
FIG. 5(c) shows the state that an electrode 6 is provided on the piezoelectric single crystal substrate 4A.
Figure 6:
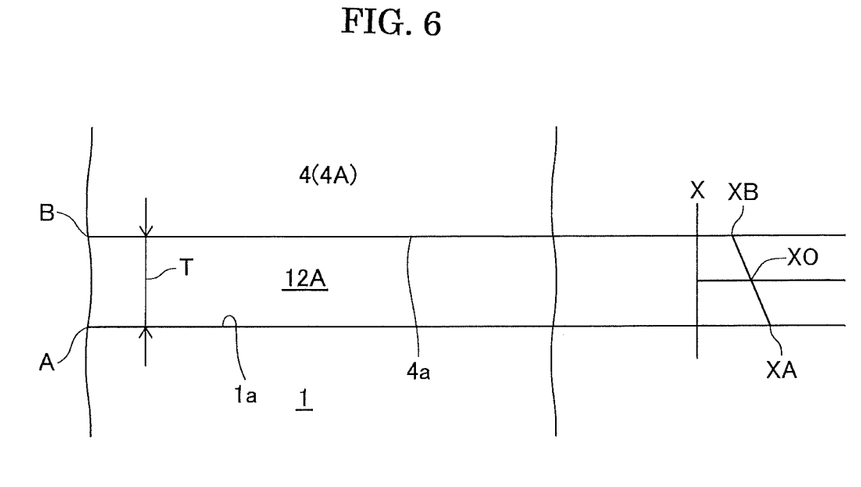
FIG. 6 is a conceptual diagram showing the oxygen ratio in the bonding layer 12A.

According to an embodiment of FIGS. 4 to 6, a bonding layer 12A is formed on a supporting substrate 1, and the bonding layer 12A is bonded to a piezoelectric single crystal substrate 4.

That is, as shown in FIG. 4(a), a bonding layer 12 is provided on a surface 1a of the supporting substrate 1. At this time, unevenness may be present on a surface 12a of the bonding layer 12.

Then, according to a preferred embodiment, the surface 12a of the bonding layer 12 is subjected to flattening process to form a flat surface 12b in the bonding layer 12A, as shown in FIG. 4(b). By this flattening process, the thickness of the bonding layer 12 is normally made smaller to provide a thinner bonding layer 12A (refer to FIG. 4(b)). However, the flattening process is not necessarily performed. Then, neutralized beam is irradiated onto the surface 12b of the bonding layer 12A, as arrows A, to activate the surface of the bonding layer 12A to provide an activated surface.

Further, as shown in FIG. 4(c), neutralized beam C is irradiated onto a surface of a piezoelectric single crystal substrate 4 to activate the surface to provide an activated surface 4a. Then, as shown in FIG. 5(a), the activated surface 12b of the bonding layer 12A and the surface 4a of the piezoelectric single crystal substrate 4 are directly bonded with each other to obtain a bonded body 15 (refer to FIG. 5(a)). Thereafter, as shown in FIGS. 5(b) and 5(c), the surface 4b of the piezoelectric single crystal substrate 4 of the bonded body 15 is further subjected to polishing to obtain a bonded body 15A, and predetermined electrodes 6 are formed on the polished surface 4c of the piezoelectric single crystal substrate 4A to produce an acoustic wave device 17.

According to the present embodiment, as shown in a schematic diagram of FIG. 6, the oxygen ratio x is increased from the end part of the bonding layer 4 (4A) on the side of the piezoelectric single crystal substrate 12A to the end part of the bonding layer 12A on the side of the supporting substrate 1. Then, the oxygen ratio xB at the end part (vicinity of the interface B) of the bonding layer 12A on the side of the piezoelectric single crystal substrate 4 (4A) is the minimum value of the oxygen ratio in the bonding layer and 0.001 or higher and 0.408 or lower, and the oxygen ratio xA at the end part (vicinity of the interface A) of the bonding layer 12A on the side of the supporting substrate 1 is the maximum value of the oxygen ratio in the bonding layer and 0.013 or higher and 0.666 or lower. The oxygen ratio xO at the central part of the bonding layer is between xA and xB.

Further, according to a preferred embodiment, the interface A is the interface at which the supporting substrate 1 and bonding layer 2A are directly bonded with each other, and the oxygen ratio xA takes the minimum value at the end part (vicinity of the interface A) of the bonding layer 2A on the side of the supporting substrate 1. Alternatively, according to a preferred embodiment, the interface B is the interface at which the piezoelectric single crystal substrate 4 (4A) and the bonding layer 12A are directly bonded with each other, and the oxygen ratio xB takes the minimum value at the end part (vicinity of the interface B) of the bonding layer 12A on the side of the piezoelectric single crystal substrate 4 (4A) takes the minimum value. The bonding strength and Q value are thereby made the best.

Here, the oxygen ratio is increased (or decreased) from the end part of the bonding layer 2, 2A, 12 or 12A on the side of the piezoelectric single crystal substrate 4 or 4A to the end part of the bonding layer 2, 2A, 12 or 12A on the side of the supporting substrate 1. Although it is preferred that the oxygen ratio is increased (or decreased) over the whole thickness of the bonding layer, it is permitted that the oxygen ratio is constant in a part of the bonding layer in the direction of thickness and the oxygen ratio is increased (or decreased) in the remaining part.

Respective constituents of the present invention will be described further in detail below.

According the present invention, the supporting substrate 1 is composed of a polycrystalline ceramic material or monocrystalline material. The monocrystalline material forming the supporting substrate 1 may preferably be silicon and sapphire. Further, the polycrystalline ceramic material may preferably be a material selected from the group consisting of mullite, cordierite, translucent alumina and sialon.

Specifically, as the materials of the piezoelectric single crystal 4 and 4A, single crystals of lithium tantalate (LT), lithium niobate (LN), lithium niobate-lithium tantalate solid solution, quartz and lithium borate may be listed. Among them, LT or LN are more preferred. As LT or LN has a high propagation speed of a surface acoustic wave and large electro-mechanical coupling factor, it is preferred for use in a piezoelectric surface acoustic wave device for high frequency and wide-band frequency applications. Further, the normal direction of the main surface of the piezoelectric single crystal substrate 4 or 4A is not particularly limited. However, in the case that the piezoelectric single crystal substrate 4 or 4A is made of LT, for example, it is preferred to use the substrate rotated from Y-axis to Z-axis by 36 to 47° (for example 42°) with respect to X-axis, which is a direction of propagation of a surface acoustic wave, because of a low propagation loss. In the case that the piezoelectric single crystal substrate 4 or 4A is made of LN, it is preferred to use the substrate rotated from Y-axis to Z-axis by 60 to 68° (for example 64°) with respect to X-axis, which is a direction of propagation of a surface acoustic wave, because of a lower propagation loss. Further, although the size of the piezoelectric single crystal substrate 4 or 4A is not particularly limited, for example, the diameter may be 50 to 150 mm and thickness may be 0.2 to 60 μm.

The electrical resistivity of the bonding layer 2, 2A, 12 or 12A may preferably be $4.8 \times 10^3$ Ω·cm or higher, more preferably be $5.8 \times 10^3$ Ω·cm or higher, and particularly preferably be $6.2 \times 10^3$ Ω·cm or higher. Further, the electrical resistivity of the bonding layer 2, 2A, 12 or 12A is generally $1.0 \times 10^8$ Ω·cm or lower.

Although the thickness T of the bonding layer 2, 2A, 12 or 12A is not particularly limited, it may preferably be 0.01 to 10 μm and more preferably be 0.05 to 0.5 μm, on the viewpoint of production cost.

Although the film-forming method of the bonding layer 2, 2A, 12 or 12A is not particularly limited, sputtering method, chemical vapor deposition (CVD) method and vapor deposition method may be listed. Here, particularly preferably, during reactive sputtering using a sputtering target of Si, the amount of oxygen gas flown into a chamber is adjusted so that the oxygen ratios (x) in the bonding layer 2, 2A, 12 or 12A can be controlled. That is, during the film formation of a single bonding layer 2, 2A, 12 or 12A, the amount of the oxygen gas may be increased to raise the oxygen ratio x and may be decreased to lower the oxygen ratio x.

Although specific conditions for manufacturing the bonding layer 2, 2A, 12 or 12A is appropriately selected depending on the specification of the chamber, according to a preferred example, the total pressure is made 0.28 to 0.34 Pa, the partial pressure of oxygen is made $1.2 \times 10^{-3}$ to $5.7 \times 10^{-2}$ Pa and the film-forming temperature is made ambient temperature. Further, Si doped with B is exemplified as the Si target.

According to a preferred embodiment, the surface 12b of the bonding layer 12 or 12A and the surface 4a of the piezoelectric single crystal substrate 4 are directly bonded with each other, or the surface 2b of the bonding layer 2 or 2A and the surface 1a of the supporting substrate 1 are directly bonded with each other. In this case, the arithmetic average roughness Ra of the surface 2b or 12b of the bonding layer 2, 2A, 12 or 12A may preferably be 1 nm or smaller and more preferably be 0.3 nm or smaller. Further, the arithmetic average roughness Ra of the surface 4a of the piezoelectric single crystal substrate 4 or the surface 1a of the supporting substrate 1 may preferably be 1 nm or smaller and more preferably be 0.3 nm or smaller. By this, the bonding strength of the piezoelectric single crystal substrate 4 or supporting substrate 1 and bonding layer 2, 2A, 12 or 12A is further improved.

The method of flattening the surfaces 2b and 12b of the bonding layers 2, 2A, 12 and 12A, and the surfaces 4a and 1a of the piezoelectric single crystal substrate 4 and supporting substrate 1 includes lapping, chemical mechanical polishing (CMP) or the like.

According to a preferred embodiment, the surface 2b of the bonding layer 2 or 2b and the surface 4a or 1a of the piezoelectric single crystal substrate 4 and supporting substrate 1 can be activated by neutralized beam. Particularly, in the case that the surface 2b or 12b of the bonding layer 2, 2A, 12 or 12A, the surface 4a of the piezoelectric single crystal substrate 4 and the surface 1a of the supporting substrate 1 are flat surfaces, the direct bonding can be easily performed.

When the activation of the surfaces is performed using the neutralized beam, it is preferred to use a system described in patent document 3 to generate the neutralized beam, which is irradiated. That is, it is used a high-speed atomic beam source of saddle field type as the beam source. Then, an inert gas is introduced into the chamber and a high voltage is applied onto electrodes from a direct current electric source. By this, electric field of saddle field type generated between the electrode (positive electrode) and a housing (negative electrode) causes motion of electrons, e, so that atomic and ion beams derived from the inert gas are generated. Among the beams reached at a grid, the ion beam is neutralized at the grid, and the beam of neutral atoms is emitted from the high-speed atomic beam source. Atomic species forming the beam may preferably be an inert gas (argon, nitrogen or the like).

In the activation step by beam irradiation, the voltage may preferably be made 0.5 to 2.0 kV, the current may preferable be made 50 to 200 mA.

Then, the activated surfaces are contacted and bonded with each other under vacuum atmosphere. The temperature at this time may be ambient temperature, specifically 40° C. or lower and more preferably 30° C. or lower. Further, the temperature during the bonding may more preferably be 20° C. or higher and 25° C. or lower. The pressure at the bonding is preferably 100 to 20000N.

The application of each of the bonded bodies 5, 5A, 15 and 15A of the present invention is not particularly limited, and it may preferably be applied as an acoustic wave device or optical device.

As the acoustic wave devices 7 and 17, a surface acoustic wave device, Lamb wave-type device, thin film resonator (FBAR) or the like is known. For example, the surface acoustic wave device is produced by providing input side IDT (Interdigital transducer) electrodes (also referred to as comb electrodes or interdigitated electrodes) for oscillating surface acoustic wave and IDT electrode on the output side for receiving the surface acoustic wave on the surface of the piezoelectric single crystal substrate. By applying high frequency signal on the IDT electrodes on the input side, electric field is generated between the electrodes, so that the surface acoustic wave is oscillated and propagated on the piezoelectric single crystal substrate. Then, the propagated surface acoustic wave is drawn as an electrical signal from the IDT electrodes on the output side provided in the direction of the propagation.

A metal film may be provided on a bottom surface of the piezoelectric single crystal substrate 4 or 4A. After the Lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surface 4b or 4c of the piezoelectric single crystal substrate 4 or 4A and that the metal film on the piezoelectric single crystal substrate is exposed through a cavity provided in the supporting body 1. Materials of such metal films include aluminum, an aluminum alloy, copper, gold or the like, for example. Further, in the case that the Lamb type wave device is produced, it may be used a composite substrate having the piezoelectric single crystal substrate 4 or 4A without the metal film on the bottom surface.

Further, a metal film and an insulating film may be provided on the bottom surface of the piezoelectric single crystal substrate 4 or 4A. The metal film plays a role of electrodes in the case that the thin film resonator is produced as the acoustic wave device. In this case, the thin film resonator has the structure that electrodes are formed on the upper and bottom surfaces of the piezoelectric single crystal substrate 4 or 4A and the insulating film is made a cavity to expose the metal film on the piezoelectric single crystal substrate. Materials of such metal films include molybdenum, ruthenium, tungsten, chromium, aluminum or the like, for example. Further, materials of the insulating films include silicon dioxide, phosphorus silicate glass, boron phosphorus silicate glass or the like.

Further, as the optical device, it may be listed an optical switching device, wavelength conversion device and optical modulating device. Further, a periodic domain inversion structure may be formed in the piezoelectric single crystal substrate 4 or 4A.

In the case that the present invention is applied to the optical device, the size of the optical device can be reduced. Further, particularly in the case that the periodic domain inversion structure is formed, it is possible to prevent the deterioration of the periodic domain inversion structure by heat treatment. Further, the materials of the bonding layers 2, 2A, 12 or 12A of the present invention are of high insulation, the generation of domain inversion is prevented during the processing by the neutralized beam before the bonding, and the shape of the domain inversion structure formed in the piezoelectric single crystal substrate 4 or 4A is hardly disordered.

EXAMPLES (Experiment A)

It was produced the bonded bodies 5 and 5A and acoustic wave device 7 of the respective examples shown in table 1, referring to FIGS. 1 to 3.

Specifically, it was used a lithium tantalate substrate (LT substrate) having an OF part, a diameter of 4 inches and a thickness of 250 μm as the piezoelectric single crystal substrate 4. It was used a 46° Y-cut X-propagation LT substrate in which the propagation direction of surface acoustic wave (SAW) is made X and the cutting angle is of rotated Y-cut plate, as the LT substrate. The surface 4a of the piezoelectric single crystal substrate 4 was subjected to mirror surface polishing so that the arithmetic average roughness Ra reached 0.3 nm. Further, Ra is measured by an atomic force microscope (AFM) in a visual field of 10 μm×10 μm.

Then, the bonding layer 2 was film-formed on the surface 4a of the piezoelectric single crystal substrate 4 by direct current sputtering method. Si doped with boron was used as a target. Further, oxygen gas was introduced as an oxygen source. At this time, the amount of the introduced oxygen gas was changed to change the total pressure of atmosphere and partial pressure of oxygen in a chamber, so that the oxygen ratio (x) of the bonding layer 2 is changed. The thickness of the bonding layer 2 was made 100 to 200 nm. The arithmetic average roughness Ra of the surface 2a of the bonding layer 2 was 0.2 to 0.6 nm. Then, the bonding layer 2 was subjected to chemical mechanical polishing (CMP) so that the film thickness was made 80 to 190 nm and Ra was made 0.08 to 0.4 nm.

Further, as the supporting substrate 1, it was prepared the supporting substrate 1 composed of Si and having the orientation flat (OF) part, a diameter of 4 inches and a thickness of 500 μm. The surfaces 1a and 1b of the supporting substrate 1 were finished by chemical mechanical polishing (CMP) so that the respective arithmetic average roughnesses Ra reached 0.2 nm.

Then, the flat surface 2b of the bonding layer 2A and surface 1a of the supporting substrate 1 were cleaned to remove the contamination, followed by introduction into a vacuum chamber. After it was evacuated to the order of $10^6$ Pa, high-speed atomic beam (at an acceleration voltage of 1 kV and Ar flow rate of 27 sccm) was irradiated onto the bonding surfaces 1a and 2b of the respective substrates, respectively, for 120 sec. Then, after the beam-irradiated surface (activated surface) 2b of the bonding layer 2A and activated surface 1a of the supporting substrate 1 were contacted with each other, the substrates 1 and 4 were bonded by pressurizing at 1000N for 2 minutes (refer to FIG. 2(a)). Then, the thus obtained bonded bodies 5 of the respective examples were heated at 100° C. for 20 hours.

Then, the surface 4b of the piezoelectric single crystal substrate 4 was subjected to grinding and polishing so that the thickness was changed from the initial 250 μm to 1 μm, to obtain the bonded body 5A (refer to FIG. 2(b)).

The following characteristics were evaluated for the thus obtained bonded bodies 5A and acoustic wave devices 7.

(Oxygen ratio (x) in bonding layer 2A)

The bonding layer 2A was evaluated according to the following conditions by Rutherford Backscattering Spectrometry.

System: supplied by National Electrostatics Corporation, "Pelletron 3SDH"
Conditions:
  Incident ion: 4H e$^{++}$
  Incident energy: 2300 keV
  Incident angle: 0 to 4 deg
  Scattering angle: 110 deg
  Sample current: 10 nA
  Beam size: 2 mmφ
  In-plane rotation: None
  Amount of irradiation: 70 μC The thus obtained results were analyzed to obtain the distribution of elements in the depth direction of the bonding layer 2A. The following parameters were used for the analysis.

Film Thickness of Bonding Layer 2A:
Value measured by an optical non-contact film thickness meter (NANOMETRICS incorporated, nano-spec film thickness measurement apparatus, model 5000)

Atomic number density of lithium tantalate:
$9.52 \times 10^{22}$ atoms/cm$^3$

The measured value of the film thickness of the thus obtained bonding layer 2A as described above and distribution of elements (including distribution of oxygen ratios) in the direction of depth (thickness) of the bonding layer 2A were compared with each other to read the oxygen ratio xB at the end part of the bonding layer 2A on the side of the piezoelectric single crystal substrate 4A and the oxygen ratio xA of the bonding layer 2A on the side of the supporting substrate 1. At this time, the measured values xB and xA at the respective end parts are measured values each in a range of a thickness of 5 nm from each of the respective interfaces.

(Bonding Strength)
The bonding strengths of the bonded bodies 5A of the respective examples were measured by crack opening method.

(Q Value)
The acoustic wave device 7 was then produced and the Q value was measured.

Specifically, the IDT electrodes 6 for generating the surface acoustic wave were formed through photolithography step. The electrodes 6 were formed, followed by dicing into small pieces to obtain acoustic wave device chips each having sizes of 5 mm in the direction of propagation and 4 mm in the vertical direction.

The measurement results were shown in table 1.

TABLE 1

| | Material of Piezoelectric single crystal substrate 4 | Oxygen ratio (x) of Si(1 − x)Ox in bonding layer 2A | | | Material of Supporting Substrate 1 | Interface Formed by direct bonding | Bonding Strength (J/m2) | Q value |
| | | End part on the side of piezoelectric single crystal substrate 4A | Central part | End part On the side of Supporting substrate 1 | | | | |
|---|---|---|---|---|---|---|---|---|
| Inventive Example 1 | LT | 0.013 | 0.007 | 0.001 | Si | Si(1 − x)Ox//Si | 1.5 | 1700 |
| Comparative Example 1 | LT | 0.007 | 0.007 | 0.007 | Si | Si(1 − x)Ox//Si | 1.5 | 1200 |
| Comparative Example 2 | LT | 0.009 | 0.005 | 0.001 | Si | Si(1 − x)Ox//Si | 1.5 | 1100 |

As the inventive example 1 and comparative examples 1 and 2 are compared, the requirements of the present invention are satisfied and the bonding strength and Q values were high, according to the inventive example 1 (Q value: 1700). On the other hand, according to the comparative example 1, the oxygen ratio x in the bonding layer 2A was constant. As a result, although the average value of the oxygen ratio x in the whole bonding layer 2A was comparable with that of the inventive example 1, the Q value was considerably reduced (Q value: 1200). According to the comparative example 2, although the oxygen ratio x is decreased from the end part on the side of the piezoelectric single crystal substrate 4A to the end part of the side of the supporting substrate 1, the oxygen ratio xB at the end part of the bonding layer 2A on the side of the piezoelectric single crystal substrate 4A is as low as 0.009, so that the Q value was considerably reduced (Q value: 1100).

(Experiment B)

The bonded body 5A and acoustic wave device 7 were produced according to the same procedure as that in the Experiment A. However, the oxygen ratio x in the bonding layer 2A was changed, as shown in table 2, in the Experiment A. The bonding strength and Q value were measured as the same procedure as the Experiment A as to the thus obtained bonded bodies 5A and acoustic wave devices 7, and the results were shown in table 2.

TABLE 2

| | | Oxygen ratio (x) of Si(1 − x)Ox in bonding layer 2A | | | | | | |
|---|---|---|---|---|---|---|---|---|
| | Material of Piezoelectric single crystal substrate 4 | End part on the side of piezoelectric single crystal substrate 4A | Central part | End part On the side of Supporting substrate 1 | Material of Supporting Substrate 1 | Interface Formed by direct bonding | Bonding Strength (J/m2) | Q value |
| Inventive Example 2 | LT | 0.666 | 0.334 | 0.001 | Si | Si(1 − x)Ox//Si | 1.5 | 2000 |
| Inventive Example 3 | LT | 0.666 | 0.537 | 0.408 | Si | Si(1 − x)Ox//Si | 1.5 | 2000 |
| Comparative Example 1 | LT | 0.001 | 0.001 | 0.001 | Si | Si(1 − x)Ox//Si | 1.5 | 1000 |
| Comparative Example 1 | LT | 0.333 | 0.333 | 0.333 | Si | Si(1 − x)Ox//Si | 1.5 | 1900 |
| Comparative Example 2 | LT | 0.666 | 0.666 | 0.666 | Si | Si(1 − x)Ox//Si | 0.3 | — |

As the inventive examples 2 and 3 and comparative examples 3 to 5 are compared, a high bonding strength and Q value were obtained in the inventive examples 2 and 3 (Both Q values: 2000). Contrary to this, according to the comparative example 3, the oxygen ratio x in the bonding layer 2A was constant and the maximum value of the oxygen ratio x in the bonding layer 2A was as low as 0.001, so that the Q value was proved to be low (Q value: 1000). Further, according to the comparative example 5, the oxygen ratio x in the bonding layer 2A was constant and the minimum value x in the bonding layer 2A was as high as 0.666, so that the bonding strength was low and the acoustic wave device 7 could not be produced. According to the comparative example 4, the oxygen ratio x in the bonding layer 2A was constant and the maximum value (minimum value) of x was made 0.333, so that the Q value was deteriorated compared with those of the inventive examples 2 and 3 (Q value: 1900).

(Experiment C)

According to the Experiment C, different from the Experiment A, as shown in FIGS. 4 to 6, the bonding layer 12 was film-formed on the supporting substrate 1, not on the piezoelectric single crystal substrate 4.

Specifically, it was prepared the supporting substrate 1 having an orientation flat (OF) part, a diameter of 4 inches and a thickness of 500 μm. The surfaces 1a and 1b of the supporting substrate 1 were finished by chemical mechanical polishing (CMP), and the arithmetic average roughness Ra of each of the surfaces was 0.3 to 1.0 nm. The piezoelectric single crystal substrate 4 was made the same as that in the Experiment A.

Then, the bonding layer 12 was formed on the surface 1a of the supporting substrate 1 according to the same procedure as that of the Experiment A. Then, the flat surface 12b of the bonding layer 12A and the surface 4a of the piezoelectric single crystal substrate 4 were cleaned to remove the contamination, followed by introduction into a vacuum chamber. After it was subjected to evacuation to vacuum in the order of $10^{-6}$ Pa, high-speed atomic beam (acceleration voltage of 1 kV and Ar flow rate of 27 sccm) was irradiated onto the bonding surfaces 12b and 4a of the respective substrates 1 and 4 for 120 sec. Then, the beam-irradiated surface (activated surface) 12b of the bonding layer 12A and the activated surface 4a of the piezoelectric single crystal substrate 4 were contacted with each other, followed by pressurizing at 10000N for 2 minutes to bond the substrates (refer to FIG. 5(a)). Then, the thus obtained bonded bodies 15 of the respective examples were heated at 100° C. for 20 hours.

The surface 4b of the piezoelectric single crystal substrate 4 was then ground and polished until the thickness was changed to the initial 250 μm to 1 μm to obtain the bonded body 15A (refer to FIG. 5(b)).

The oxygen ratio (x), bonding strength and Q value of the respective parts in the bonding layer 12A were evaluated for each of the thus obtained bonded bodies 15A of the respective examples. The measurement results were shown in table 3.

TABLE 3

| | Material of Piezoelectric single crystal substrate 4 | Oxygen ratio (x) of Si(1 − x)Ox in bonding layer 12A | | | Material of Supporting Substrate 1 | Interface Formed by direct bonding | Bonding Strength (J/m2) | Q value |
|---|---|---|---|---|---|---|---|---|
| | | End part on the side of piezoelectric single crystal substrate 4A | Central part | End part On the side of Supporting substrate 1 | | | | |
| Inventive Example 4 | LT | 0.001 | 0.007 | 0.013 | Si | LT//Si(1 − x)Ox | 1.5 | 1700 |
| Inventive Example 5 | LT | 0.001 | 0.334 | 0.666 | Si | LT//Si(1 − x)Ox | 1.5 | 2000 |
| Inventive Example 6 | LT | 0.408 | 0.537 | 0.666 | Si | LT//Si(1 − x)Ox | 1.5 | 2000 |

According to the inventive examples 4, 5 and 6, the conditions of the present invention are satisfied and the bonding strength and Q value are high (Q value of the inventive example 4 was similar to that of the inventive example 1, Q value: 1700, Q value of the inventive example 5 was similar to that of the inventive example 2, Q value: 2000, Q value of the inventive example 6 was similar to that of the inventive example 6, Q value: 2000). Particularly, according to the inventive examples 4, 5 and 6, the interface of the direct bonding is present between the piezoelectric single crystal substrate 4A and bonding layer 12A, and further in this case, it is proved that the present invention is effective.

(Experiment D)

The bonded body 5A and acoustic wave device 7 were produced according to the similar procedure as the Experiment A. However, the material of the supporting substrate 1 was changed as shown in table 4 in the Experiment A. That is, the material of the supporting substrate 1 was made sapphire in the inventive example 7, mullite in the inventive example 8, cordierite in the inventive example 9, translucent alumina sintered body in the inventive example 10, and sialon in the inventive example 11. The bonding strength and Q value of the thus obtained respective bonded bodies 5A and acoustic wave devices 7 were measured, according to the same procedure as that in the Experiment A, and the results were shown in table 4.

TABLE 4

| | Material of Piezoelectric single crystal substrate 4 | Oxygen ratio (x) of Si(1 − x)Ox in bonding layer 2A | | | Material of Supporting Substrate 1 | Interface Formed by direct bonding | Bonding Strength (J/m2) | Q value |
|---|---|---|---|---|---|---|---|---|
| | | End part on the side of piezoelectric single crystal substrate 4A | Central part | End part On the side of Supporting substrate 1 | | | | |
| Inventive Example 7 | LT | 0.666 | 0.334 | 0.001 | Sapphire | Si(1 − x)Ox // Sapphire | 1.5 | 2200 |
| Inventive Example 8 | LT | 0.666 | 0.334 | 0.001 | Mullite | Si(1 − x)Ox // Mullite | 1.5 | 2500 |
| Inventive Example 9 | LT | 0.666 | 0.334 | 0.001 | Cordierite | Si(1 − x)Ox // Cordierite | 1.5 | 2500 |
| Inventive Example 10 | LT | 0.666 | 0.334 | 0.001 | Translucent Alumina | Si(1 − x)Ox // Translucent Alumina | 1.5 | 2300 |
| Inventive Example 11 | LT | 0.666 | 0.334 | 0.001 | Sialon | Si(1 − x)Ox // sialon | 1.5 | 2500 |

According to the inventive examples 7 to 11, the material of the supporting substrate 1 was changed to sapphire or various kinds of ceramic materials. It was thus confirmed that high bonding strength and Q value could be obtained (Q value in the inventive example 7: 2200, Q value in the inventive example 8: 2500, Q value in the inventive example 9: 2500, Q value in the inventive example 10: 2300, Q value in the inventive example 11: 2500).

The invention claimed is:

1. A bonded body comprising:
    a supporting substrate comprising a polycrystalline ceramic material or a monocrystalline material;
    a piezoelectric single crystal substrate; and
    a bonding layer provided between said supporting substrate and said piezoelectric single crystal substrate,
    wherein said bonding layer has a composition of $Si_{(1-x)}O_x$ (x indicates an oxygen ratio),
    wherein said oxygen ratio is increased or decreased from an end part of said bonding layer on a side of said piezoelectric single crystal substrate to an end part of said bonding layer on a side of said supporting substrate,
    wherein the maximum value of said oxygen ratio x in said bonding layer is 0.013 or higher and 0.666 or lower, and
    wherein the minimum value of said oxygen ratio x is 0.001 or higher and 0.408 or lower.

2. The bonded body of claim 1,
    wherein said oxygen ratio is decreased from said end part of said bonding layer on the side of said piezoelectric single crystal substrate to said end part of said bonding layer on the side of said supporting substrate,
    wherein said oxygen ratio x at said end part of said bonding layer on the side of said piezoelectric single crystal substrate is 0.013 or higher and 0.666 or lower, and
    wherein said oxygen ratio x at said end part of said bonding layer on the side of said supporting substrate is 0.001 or higher and 0.408 or lower.

3. The bonded body of claim 1,
    wherein said oxygen ratio is increased from said end part of said bonding layer on the side of said piezoelectric single crystal substrate to said end part of said bonding layer on the side of said supporting substrate,
    wherein said oxygen ratio x at said end part of said bonding layer on the side of said piezoelectric single crystal substrate is 0.001 or higher and 0.408 or lower, and
    wherein said oxygen ratio x at said end part of said bonding layer on the side of said supporting substrate is 0.013 or higher and 0.666 or lower.

4. The bonded body of claim 1, wherein said supporting substrate comprises a material selected from the group consisting of silicon, sapphire, mullite, cordierite, translucent alumina and sialon.

5. The bonded body of claim 1, wherein said piezoelectric single crystal substrate comprises lithium niobate, lithium tantalate or lithium niobate-lithium tantalate solid solution.

6. An acoustic wave device comprising:
    said bonded body of claim 1; and
    an electrode provided on said piezoelectric single crystal substrate.

* * * * *